(12) United States Patent
Shichi et al.

(10) Patent No.: US 10,304,657 B2
(45) Date of Patent: May 28, 2019

(54) MIRROR ION MICROSCOPE AND ION BEAM CONTROL METHOD

(71) Applicant: Hitachi, Ltd., Chiyoda-ku, Tokyo (JP)

(72) Inventors: Hiroyasu Shichi, Tokyo (JP); Masaki Hasegawa, Tokyo (JP); Teruo Kohashi, Tokyo (JP); Shinichi Matsubara, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/548,531

(22) PCT Filed: Feb. 9, 2015

(86) PCT No.: PCT/JP2015/053450
§ 371 (c)(1),
(2) Date: Aug. 3, 2017

(87) PCT Pub. No.: WO2016/129026
PCT Pub. Date: Aug. 18, 2016

(65) Prior Publication Data
US 2018/0025888 A1   Jan. 25, 2018

(51) Int. Cl.
*H01J 37/29* (2006.01)
*H01J 37/28* (2006.01)
(Continued)

(52) U.S. Cl.
CPC .............. *H01J 37/29* (2013.01); *H01J 37/08* (2013.01); *H01J 37/22* (2013.01); *H01J 37/265* (2013.01); *H01J 37/28* (2013.01); *H01J 37/317* (2013.01)

(58) Field of Classification Search
CPC ........ H01J 37/29; H01J 37/265; H01J 37/147; H01J 37/26; H01J 2237/04735;
(Continued)

(56) References Cited

U.S. PATENT DOCUMENTS

| 6,878,937 B1 | 4/2005 | Mankos |
| 2002/0117635 A1 | 8/2002 | Shinada et al. |

(Continued)

FOREIGN PATENT DOCUMENTS

| JP | 11-108864 A | 4/1999 |
| JP | 2001-242104 A | 9/2001 |

(Continued)

OTHER PUBLICATIONS

International Search Report (PCT/ISA/210) issued in PCT Application No. PCT/JP2015/053450 dated Apr. 28, 2015 with English translation (6 pages).
(Continued)

*Primary Examiner* — Wyatt A Stoffa
(74) *Attorney, Agent, or Firm* — Crowell & Moring LLP

(57) ABSTRACT

A device including an imaging-type or a projection-type ion detection system and being capable of performing observation or inspection at high speed with an ultrahigh resolution in a sample observation device using an ion beam is provided. The device includes a gas field ion source that generates an ion beam, an irradiation optical system that irradiates a sample with the ion beam, a potential controller that controls an accelerating voltage of the ion beam and a positive potential to be applied to the sample and an ion detection unit that images or projects ions reflected from the sample as a microscope image, in which the potential controller includes a storage unit storing a first positive potential allowing the ion beam to collide with the sample and a second positive potential for reflecting the ion beam before allowing the ion beam to collide with the sample.

10 Claims, 4 Drawing Sheets

(51) Int. Cl.
*H01J 37/317* (2006.01)
*H01J 37/08* (2006.01)
*H01J 37/22* (2006.01)
*H01J 37/26* (2006.01)

(58) Field of Classification Search
CPC ......... H01J 2237/04756; H01J 37/3174; H01J 2237/151; H01J 37/04; H01J 37/20
See application file for complete search history.

(56) References Cited

U.S. PATENT DOCUMENTS

| | | | |
|---|---|---|---|
| 2004/0075054 A1 | 4/2004 | Knippelmeyer | |
| 2006/0011835 A1* | 1/2006 | Murakoshi | H01J 37/147 250/310 |
| 2006/0249676 A1* | 11/2006 | Shinada | H01J 37/29 250/310 |
| 2007/0181808 A1* | 8/2007 | Murakoshi | H01J 37/29 250/310 |
| 2007/0194229 A1* | 8/2007 | Okuda | H01J 37/026 250/310 |
| 2007/0194232 A1* | 8/2007 | Nagahama | H01J 37/026 250/310 |
| 2008/0073533 A1* | 3/2008 | Makino | G03F 7/70616 250/310 |
| 2008/0265161 A1* | 10/2008 | Murakoshi | H01J 37/147 250/311 |
| 2009/0146074 A1* | 6/2009 | Banzhof | H01J 37/04 250/396 R |
| 2009/0224170 A1* | 9/2009 | Yamazaki | H01J 37/244 250/397 |
| 2009/0261252 A1* | 10/2009 | Hasegawa | H01J 37/29 250/311 |
| 2009/0289191 A1* | 11/2009 | Frosien | H01J 37/265 250/396 R |
| 2011/0284746 A1* | 11/2011 | Shimakura | H01J 37/265 250/310 |
| 2012/0235055 A1 | 9/2012 | Madokoro et al. | |
| 2012/0241640 A1* | 9/2012 | Ward | H01J 27/26 250/396 R |
| 2013/0087703 A1* | 4/2013 | Onishi | H01J 37/065 250/306 |
| 2013/0092831 A1 | 4/2013 | Kyogaku et al. | |

FOREIGN PATENT DOCUMENTS

| | | |
|---|---|---|
| JP | 2004-134387 A | 4/2004 |
| JP | 2005-228743 A | 8/2005 |
| JP | 2008-140557 A | 6/2008 |
| JP | 2009-211961 A | 9/2009 |
| JP | 2011-123998 A | 6/2011 |
| JP | 2011-243487 A | 12/2011 |
| JP | 2013-101101 A | 5/2013 |
| JP | 2014-78458 A | 5/2014 |

OTHER PUBLICATIONS

Japanese-language Written Opinion (PCT/ISA/237) issued in PCT Application No. PCT/JP2015/053450 dated Apr. 28, 2015 (6 pages).

* cited by examiner

[FIG. 1]
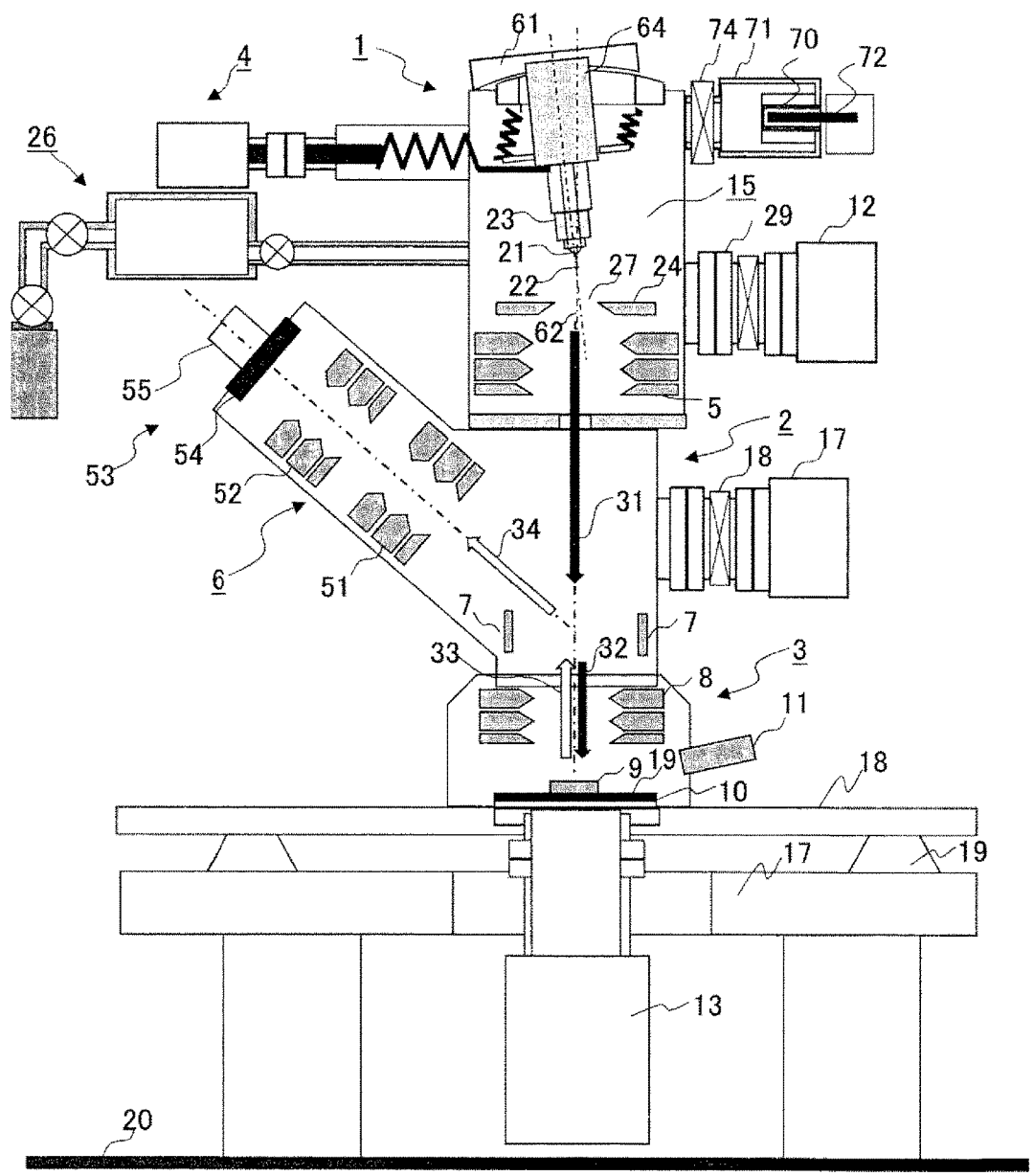

[FIG. 2]
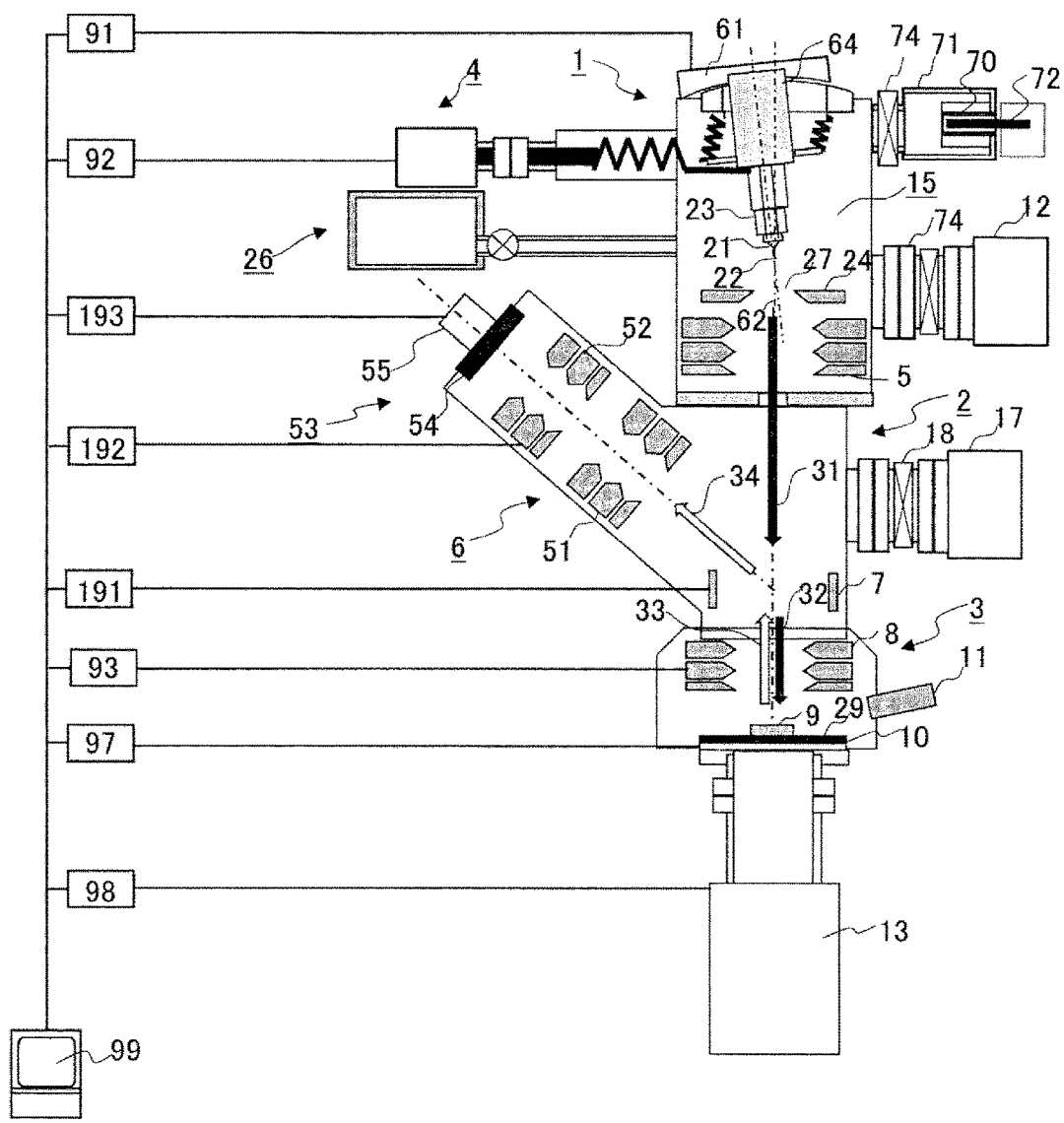

MIRROR ION MICROSCOPE AND ION BEAM CONTROL METHOD

TECHNICAL FIELD

The present invention relates to a mirror ion microscope and an ion beam control method.

BACKGROUND ART

A sample is irradiated while being scanned with electrons, and secondary charged particles emitted from the sample are detected, thereby observing a structure on a surface of the sample. This is called a scanning electron microscope (hereinafter abbreviated as SEM). Moreover, a sample is irradiated with an electron beam after a negative potential as compared with an accelerating voltage of electrons is given to the sample, thereby imaging mirror electrons trajectories of which are reversed before colliding with the sample. This is called a mirror electron microscope (MEM). Furthermore, for example, a potential of approximately 20 V positive as compared with the accelerating voltage of electrons is given to the sample, and an irradiation electron beam collides with a sample surface with low energy and reflected electrons are imaged after the collision with the sample surface. This is called a low-energy emission electron microscope (LEEM). According to the above microscopes, ultrafine foreign matters or defects on the sample can be found. A mirror electron microscope is disclosed in Patent Document 1 and a low-energy emission electron microscope is disclosed in Patent Document 2.

As an imaging-type optical system is used particularly in MEM and LEEM, they are expected as high-speed inspection devices in manufacturing of electron devices as observation can be performed at higher speed as compared with SEM.

On the other hand, it is also possible to observe a structure on the sample surface by focusing an ion beam and irradiating the sample while being scanned with the ion beam to thereby detect secondary electrons, secondary ions, reflected ions and so on emitted from the sample. This is called a scanning ion microscope (hereinafter abbreviated as SIM). In Patent Literature 3, a scanning ion microscope using a liquid metal ion source is disclosed. In Patent Literature 4, a scanning ion microscope using a gas field ion source is disclosed.

CITATION LIST

Patent Literature

Patent Literature 1: JP-A-11-108864
Patent Literature 2: JP-A-2005-228743
Patent Literature 3: JP-A-2011-123998
Patent Literature 4: JP-A-2008-140557

SUMMARY OF INVENTION

Technical Problem

As it is difficult to ignore a nature as an electron wave in an electron beam, an aberration is generated due to a diffraction effect. On the other hand, as the ion beam is heavier than electrons, the aberration due to the diffraction effect is extremely smaller than that of electrons. Also in the ion beam irradiation, a penetration depth to the sample is shallower and a width is narrower than electron beam irradiation in the same condition. Furthermore, in the ion beam irradiation, an ability of moving atoms on the sample surface is higher, and a sputtering phenomenon in which atoms are emitted in a vacuum also occurs.

In the SIM in which scanning is performed with the ion beam, a resolution sufficient for finding a foreign matter on the sample can be obtained even in the past, however, a practical inspection device has not been realized because time is required for observation as described above. A practical inspection device for imaging secondary electrons, secondary ions and so on emitted from the sample to perform observation has not been realized either since such device has a low resolution.

An object of the present invention is to provide a device particularly including an imaging-type or a projection-type ion detection system in a sample observation device using an ion beam and capable of performing high-speed observation or inspection with an ultrahigh resolution. Additionally, another object is to provide a device capable of performing observation after surface cleaning which has been difficult in the electron beam device, or to provide a device capable of observing structures and defects in a depth direction.

Solution to Problem

A mirror ion microscope according to the present invention includes a gas field ion source that generates an ion beam, an irradiation optical system that irradiates a sample with the generated ion beam, a potential controller that controls an accelerating voltage of the ion beam and a positive potential to be applied to the sample and an imaging-type or a projection-type ion detection unit that images or projects ions reflected from the sample as a microscope image, in which the potential controller includes a storage unit storing a first positive potential allowing the ion beam to collide with the sample and a second positive potential reversing a trajectory before allowing the ion beam to collide with the sample.

An ion beam control method according to the present invention includes a generation step of generating an ion beam, an irradiation step of irradiating a sample with the generated ion beam, a potential control step of controlling an accelerating voltage of the ion beam and a positive potential to be applied to the sample, and an image forming step of imaging or projecting ions trajectories of which are reversed before colliding with the sample by the potential control step as a microscope image.

Moreover, a mirror ion microscope according to the present invention includes an ion source that generates anion beam, an irradiation optical system that irradiates a sample with the generated ion beam, a sample potential controller that controls a positive potential to be applied to the sample and an imaging-type or a projection-type detection optical system that images or projects ions trajectories of which are reversed before colliding with the sample as a microscope image.

Advantageous Effects of Invention

According to the present invention, the device particularly including the imaging-type or the projection-type ion detection system and capable of performing high-speed observation or inspection is provided in the sample observation device using the ion beam.

BRIEF DESCRIPTION OF DRAWINGS

FIG. 1 is a schematic structure view showing an example of an ion beam device according to the present invention.

FIG. 2 is a schematic structure view showing an example of control systems in the ion beam device according to the present invention.

DESCRIPTION OF EMBODIMENTS

Figures 3A, 3B:
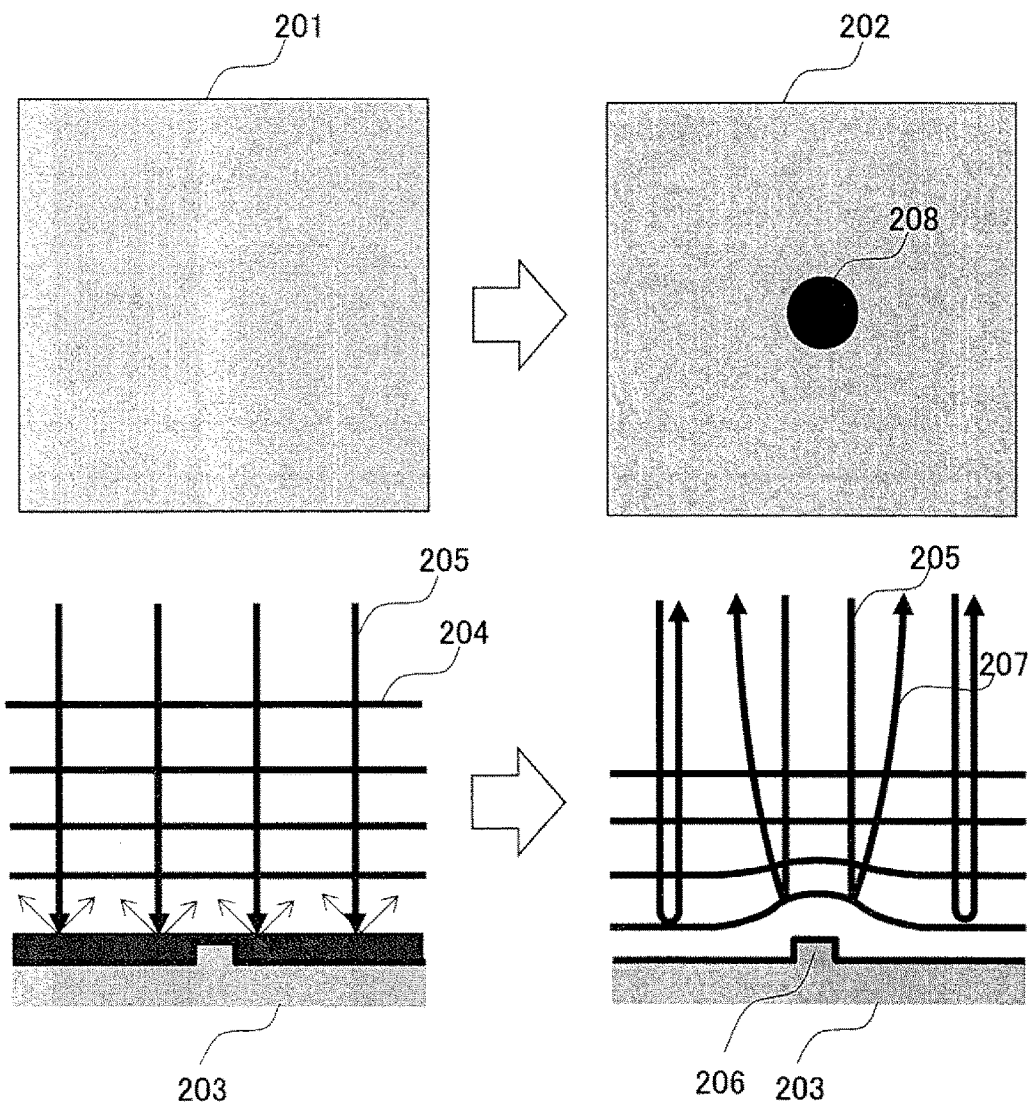
FIGS. 3A and 3B are schematic views showing operations of the ion beam device according to the present invention.

Prior to the detailed description of the present invention, respective structures and advantages thereof will be cited and explained.

(1) A mirror ion microscope includes a gas field ion source that generates an ion beam, an irradiation optical system that irradiates a sample with the generated ion beam, a potential controller that controls an accelerating voltage of the ion beam and a positive potential to be applied to the sample and an imaging-type or a projection-type ion detection unit that images or projects ions reflected from the sample as a microscope image, in which the potential controller includes a storage unit storing a first positive potential allowing the ion beam to collide with the sample and a second positive potential reversing a trajectory before allowing the ion beam to collide with the sample.

According to the above, a device having an imaging-type or a projection-type ion detection system, not a scanning type such as in a scanning ion microscope, and capable of performing high-speed observation or inspection of the sample by detecting mirror ions is provided in a sample observation device using an ion beam. In particular, there is an advantage that detection of a foreign matter can be performed at high resolution without an effect by a stray magnetic field in an installation position of the microscope with less shakes and drift in the image as compared with the conventional mirror electron microscope. Moreover, as the gas field ion source is used, there is an advantage that a mirror microscope image with higher resolution can be obtained as compared with cases of using other ion sources such as a duo plasma ion source, a panning-type ion source, an inductively coupled plasma (ICP) ion source and a microwave induced plasma (MIP) ion source. In particular, it is also possible to use an ion beam with a large current at the time of performing observation or inspection by the imaging-type or the projection-type ion detection system because of the mirror microscope. When the ion beam current is increased, observation or inspection can be performed at high speed, furthermore, ultrahigh resolution can be realized because of the imaging-type or the projection-type ion detection system. Also according to the present device, not only observation by mirror ions trajectories of which are reversed without colliding with the sample but also observation by reflected ions colliding with the sample can be realized. In the case where only mirror ions not colliding with the sample are detected, there is an advantage that damage due to ion collision is not added to the sample.

(2) In the mirror ion microscope according to (1), the potential controller may include a sputter controller for removing part of a surface of the sample by setting the first positive potential and an image acquisition controller for obtaining a microscope image by setting the second positive potential.

According to the above, not only observation by mirror ions not colliding with the sample but also observation by reflected ions colliding with the sample is realized. Furthermore, there is an advantage that sputtering on the sample surface can be performed by allowing the ion beam to collide with the sample.

(3) The mirror ion microscope according to (2) may further include a display unit displaying a first microscope image obtained by setting the second positive potential with respect to a sample observation region and a second microscope image obtained by setting the second positive potential after setting the first positive potential with respect to the sample observation region and performing the sputter.

According to the above, there is an advantage that a mirror ion image is obtained after removing part of atoms on the sample surface, that is, after the surface is cleaned. Moreover, the removal of part of atoms on the sample surface and the observation by the mirror ion microscope are repeated, thereby obtaining a mirror ion image in a depth direction of the sample.

(4) In the mirror ion microscope according to (1), a gas type to be supplied to the emitter tip when the first positive potential is applied may include at least one type of argon, xenon and krypton.

According to the above, there is an advantage that the microscope is not easily affected by magnetic field noise. In particular, there is an advantage that processing in the depth direction with low damage at high speed can be performed as compared with cases of hydrogen and neon. Note that mixed gases containing plural types of gasses such as a mixed gas of two types and a mixed gas of three types may be used.

(5) In the ion beam device according to (1), a gas type to be supplied to the emitter tip when the first positive potential is applied may include at least one type of neon and helium in the mirror ion microscope. According to the above, in cases of using neon or helium, an advantage that processing with less movement of atoms on the sample surface can be performed or an advantage that thermal damage is small can be obtained. Note that mixed gases containing plural types of gasses such as a mixed gas of two types and a mixed gas of three types may be used. According to the present invention, the above advantages can be obtained.

(6) In the mirror ion microscope according to (1), an evacuation unit that performs evacuation of the irradiation optical system may be provided with a non-evaporable getter pump.

According to the above, there is an advantage that ion beam irradiation current becomes stable and noise to an ion microscope image is reduced by using the non-evaporable getter pump.

(7) An ion beam control method includes a generation step of generating an ion beam, an irradiation step of irradiating a sample with the generated ion beam, a potential control step of controlling an accelerating voltage of the ion beam and a positive potential to be applied to the sample and an image forming step of imaging or projecting ions reflected on the sample by the potential control step as a microscope image.

According to the above, a device particularly including an imaging-type or a projection-type ion detection system, not a scanning type such as in a scanning ion microscope, and capable of performing high-speed observation or inspection of the sample by detecting mirror ions is provided. An inspection device capable of detecting foreign matters and defects on a sample is provided. In particular, there is an advantage that detection of a foreign matter can be performed at high resolution without an effect by a stray magnetic field in an installation position of the microscope with less shakes and drift in the image as compared with the conventional mirror electron microscope.

(8) In the ion beam control method according to (7), the potential control step may include a sputtering step of removing part of a surface of the sample by allowing the ion beam to collide with the sample and an image acquisition step of obtaining a microscope image by reflecting the ion beam before allowing the ion beam to collide, and the image forming step is a step of imaging or projecting ions reflected on the sample by the image acquisition step as an microscope image.

According to the above, not only observation by mirror ions but also observation by reflected ions colliding with the sample is realized. Furthermore, sputtering on the sample surface can be performed by allowing the ion beam to collide with the sample. Observation by the mirror ion microscope can be performed after the surface is cleaned by sputtering.

(9) In the ion beam control method according to (8), the image acquisition step may be repeated at least twice or more in an order of the image acquisition step, the sputtering step and the image acquisition step to thereby obtain two or more microscope images.

According to the above, a mirror ion image in a depth direction of the sample can be obtained by repeating the sputtering that removes part of atoms on the sample surface and the observation by the mirror ion microscope.

(10) The ion beam control method according to (8) may further include a display step of displaying at least two microscope images in which depth directions are different from each other with respect to the sample surface.

According to the above, the mirror ion image in the depth direction of the sample can be obtained by repeating the sputtering that removes part of atoms on the sample surface and the observation by the mirror ion microscope.

(11) A mirror ion microscope includes an ion source that generates an ion beam, an irradiation optical system that irradiates a sample with the generated ion beam, a sample potential controller that controls a positive potential to be applied to the sample and an imaging-type or a projection-type detection optical system that images or projects ions reflected on the sample as a microscope image.

According to the above, a device particularly including an imaging-type or a projection-type ion detection system, not a scanning type such as in a scanning ion microscope, and capable of performing high-speed observation or inspection of the sample by detecting mirror ions is provided in a sample observation device using an ion beam. In particular, there is an advantage that detection of a foreign matter can be performed at high resolution without an effect by a stray magnetic field in an installation position of the microscope with less shakes and drift in the image as compared with the conventional mirror electron microscope.

(12) In the mirror ion microscope according to (11), a column of the irradiation optical system may be provided in a vertical direction with respect to a surface or a floor on which the mirror ion microscope is installed, and a column of the detection optical system may be provided in a tilted direction with respect to the surface or the floor on which the mirror ion microscope is installed.

According to the above, an irradiation ion beam 100a travels straight to a sample direction, therefore, an aberration is reduced and the ion beam having good parallelism travels toward the sample. As a result, it has been found that resolution of a mirror ion image trajectories of which are reversed before reaching the sample is increased. That is, the above-described structure in which the ion-beam irradiation system column stands upright has an advantage that resolution of the mirror ion image is improved as compared with a structure in which the ion source and the ion irradiation system column are arranged in a tilted manner to allow the irradiation ion beam to be deflected by the separator and to travel toward the sample as well as allow the mirror ion to travel straight as another choice of structures.

(13) In the mirror ion microscope according to (12), the ion source may be a gas field ion source that forms a pyramid structure at a tip of an emitter tip for generating the ion beam.

According to the above, there is an advantage that a mirror microscope image with higher resolution can be obtained as compared with cases of using other ion sources such as a duo plasma ion source, a panning-type ion source, an inductively coupled plasma (ICP) ion source and a microwave induced plasma (MIP) ion source.

Embodiment 1

An example of an ion beam device according to the present invention will be explained with reference to FIG. 1. Hereinafter, a first example of a mirror ion microscope as an ion beam device will be explained. The mirror ion microscope according to the example includes a gas field ion source 1, an ion-beam irradiation system column 2, a sample chamber 3, a cooling mechanism 4, an imaging-type detection system column 6 and a gas supply mechanism 26. Here, the gas field ion source 1, the ion-beam irradiation system column 2, the sample chamber 3, the imaging-type detection system column 6 and so on are installed so as to be contained in a vacuum chamber 15. According to the structure, foreign matters and defects on a sample can be detected.

The ion-beam irradiation system column 2 that supplies an irradiation ion beam as shown in FIG. 1 stands upright with respect to a microscope installation surface 20, namely, a floor, whereas the detection system column 6 that images a mirror ion beam is tilted. The ion-beam irradiation system column 2 also contains a separator 7 that separates an irradiation ion beam 31 travelling toward a sample 9 and an ion beam 32 returning from the sample 9.

First, the gas field ion source 1 includes a needle-shaped emitter tip 21, an extraction electrode 24 provided to face the emitter tip and having an opening 27 through which ions pass, a thin-wire shaped filament 22, a columnar-shaped filament mount 23 and a columnar-shaped emitter base mount 64.

Moreover, an ion source vacuum evacuation pump 12 for evacuating the vacuum chamber 15 of the gas field ion source 1 is provided. A valve 29 capable of executing vacuum interruption is arranged between the vacuum chamber 15 and the ion source vacuum evacuation pump 12.

Furthermore, a vacuum pump 71 containing non-evaporable getters 70 is connected to the vacuum chamber 15 of the gas field ion source 1. Valves 74 capable of executing vacuum interruption are arranged between the ion source vacuum evacuation pump 12 and the vacuum chamber 15 as well as between the vacuum pump 71 containing the non-evaporable getters 70 and the vacuum chamber 15.

The gas field ion source 1 further includes a tilt mechanism 61 for changing a tilt of the emitter tip 21, which is fixed to the emitter base mount 64. This is used for aligning a direction of a tip of the emitter tip with an ion beam irradiation axis 62 with high accuracy. In the case where the ion-beam irradiation system column stands upright with respect to the microscope installation surface 20, namely, the floor, there is an advantage that a preferable ion microscope capable of increasing tilting accuracy by the tilt mechanism 61 without drift movement in a tilt direction can be realized.

The ion beam irradiation system also includes a focusing lens 5 that focuses an ion beam emitted from the gas field ion source 1, the separator 7, an objective lens 8 for irradiating the sample 9 with the ion beam approximately in parallel and so on. The focusing lens and the objective lens are electrostatic lenses including plural electrodes. A movable aperture that limits the ion beam 31 passing through the focusing lens, a deflector that allows the ion beam passing through the aperture to scan or to be aligned are also contained though not shown, which can be used for observing an emission pattern from an ion source or a case of acquiring a scanning ion beam image.

An ion-beam irradiation system column vacuum evacuation pump 17 for evacuating the ion-beam irradiation system column 2 inside the vacuum chamber 15 is provided. A valve 18 capable of executing vacuum interruption is arranged between the vacuum chamber and the ion-beam irradiation system column vacuum evacuation pump 17. Accordingly, evacuation of the imaging-type detection system column 6 can be performed.

Moreover, in the sample chamber 3, a sample stage 10 on which the sample 9 is placed, an insulator 29 that electrically insulates between the sample and the sample stage 10, a charged particle detector 11 that detects secondary electrons, tertiary electrons, backscattered electrons and so on emitted from the sample when the ion beam collides with the sample and an electron gun (not shown) for cancelling charge-up of the sample. The ion microscope according to the embodiment further includes a sample chamber vacuum evacuation pump 13 for evacuating the sample chamber 3. Also in the sample chamber 3, a gas gun used for etching or supplying a deposition gas is provided in the vicinity of the sample, though not shown. The charged particle detector 11 also includes an ion detector.

The imaging-type detection system column 6 is provided inside the vacuum chamber, in which an intermediate ion lens 51, a projection ion lens 52 and the like are contained. An image detection unit 53 is configured by a fluorescent screen 54, a two-dimensional optical detector 55 and the like.

On a device frame 17 arranged on the floor 20, a base plate 18 is arranged through an anti-vibration mechanism 19. The gas field ion source 1, the column 2 and the sample chamber 3 can be formed as a structure supported by the base plate 18.

The cooling mechanism 4 cools the emitter tip 21 inside the gas field ion source 1. As the cooling mechanism 4, for example, a Gifford McMahon type (GM type) refrigerator or a pulse tube refrigerator can be used. In this case, a not-shown compressor unit (compressor) using helium gas as a working gas is installed on the floor 20. Vibration of the compressor unit (compressor) is transmitted to the device frame 17 through the floor 20. The anti-vibration mechanism 19 is arranged between the device frame 17 and the base plate 18 for preventing the vibration. Accordingly, transmission of high-frequency vibration on the floor to the gas field ion source 1, the ion-beam irradiation system column 2, the vacuum sample chamber 3 and so on can be reduced. The refrigerator and the compressor have been explained as causes for vibration on the floor 20 in this case. However, the present structure is effective also for vibration due to external causes other than vibration on the floor 20. The anti-vibration mechanism 19 may be configured by an anti-vibration rubber, a spring and a damper or a combination of them.

Here, a pyramid-type structure of atoms in nano-meter order is formed at the tip of the emitter tip 21 in the gas field ion source according to the embodiment. This will be called a nano-pyramid. The number of atoms formed in the nano-pyramid type structure can be changed in accordance with conditions. Typically, an extremely preferable beam can be obtained when one atom is included at the tip, a layer of three or six atoms is included under that and a layer of 10 or more atoms is included further under that.

As materials for the emitter tip, a thin wire of tungsten, molybdenum and so on may be used. As a method of forming the nano-pyramid at the tip of the emitter tip, a method of covering the emitter tip with iridium, platinum, rhenium, osmium, palladium, rhodium or the like and heating the emitter tip at high temperature by supplying power to a filament, or other methods such as field evaporation in a vacuum, gas etching, ion-beam irradiation and remodeling can be cited. According to such methods, the nano-pyramid of atoms can be formed at the tip of the tungsten wire or the molybdenum wire. For example, when a tungsten wire with a direction index <111> is used, it is characterized that the tip is formed by one or three tungsten atoms or atoms of iridium or the like. Separately, a similar nano-pyramid can be formed by performing etching or remodeling in a vacuum with respect to a tip of a thin wire of platinum, iridium, rhenium, osmium, palladium, rhodium or the like.

As described above, a feature of the emitter tip 21 of the gas field ion source according to the embodiment exists in the structure of the nano-pyramid. An electric field intensity formed at the tip of the emitter tip 21 is adjusted, thereby generating ions in the vicinity of one atom at the tip of the emitter tip. Therefore, a region where ions are emitted, namely, an ion source is an extremely small region, which is a nanometer or less. When ions are generated from an extremely limited region as described above, a beam diameter can be formed to 1 nm or less. That is, the ion source can increase a current value per a unit area and per a unit solid angle as compared with a conventional electron source. This is an important feature for obtaining an ion beam with a minute diameter and a large current on the sample.

In the case where the nano-pyramid with one atom at the tip is formed by using platinum, rhenium, osmium, iridium, palladium, rhodium and so on, electric current emitted from the unit area/unit solid angle, namely, ion-source brightness can be also increased as compared with the electron source and other ion sources. That is, the above case is preferable for reducing a beam diameter on a sample of the ion microscope and for increasing electric current. However, in the case where the emitter tip is sufficiently cooled as well as gas is sufficiently supplied, it is not always necessary to form the tip with one atom, and sufficient performance can be obtained with respect to the observation and the inspection also when the number of atoms is three, six, seven or ten. In particular, when the tip is formed with atoms of four or more and less than ten, it is possible to increase the ion-source brightness as well as realize stable operation in which atoms at the tip is hardly evaporated.

FIG. 2 shows an example of controllers for the mirror ion microscope according to the present invention shown in FIG. 1. The controllers in the example include a gas field ion source controller 91 for controlling the gas field ion source controller 1, a refrigerator controller 92 for controlling the refrigerator 4, a lens controller 93 for controlling the focusing lens 5 and the objective lens 8, a separator controller 191, a sample stage controller 97 for controlling the sample stage 10, a vacuum evacuation pump controller 98 for controlling the sample chamber vacuum evacuation pump 13, a projection-type ion optical system controller 192 for controlling the sample stage 10, the intermediate ion lens 51 and the projection ion lens 52 contained in the imaging-type detection system column 6 and the like. The controllers in the example include an image detection unit controller 193, plural power sources for applying voltages to electrodes and so on of the charged particle detector 11 and a controller thereof and a main body controller 99 having a calculation processing ability. The main body controller 99 includes an operation processing unit, a storage unit, an image display unit and so on. The image display unit displays an image generated from a detection signal of the charged particle detector 11 and information inputted by an input means.

The sample stage 10 includes a mechanism that linearly moves the sample 9 in orthogonal two directions inside a sample placing surface, a mechanism that linearly moves the sample 9 in a direction perpendicular to the sample placing surface and a mechanism that rotates the sample 9 in the sample placing surface. The sample stage 10 further includes a tilting function capable of changing an irradiation angle of the ion beam 14 to the sample 9 by rotating the sample 9 around a tilt axis. These control is executed by the sample stage controller 97 according to an instruction from the calculation processing device 99.

Next, operations of the gas field ion source according to the example will be explained. When sufficient time passes after the vacuum evacuation, the refrigerator 4 is operated. Accordingly, the emitter tip 21 is cooled. First, a positive high voltage is applied to the emitter tip as an accelerating voltage of ions. Next, a high voltage is applied to the extraction electrode 24 so as to be a negative potential with respect to the emitter tip. Then, a strong electric field is formed at the tip of the emitter tip. When an ionization gas is supplied from the supply mechanism 26 for the ionization gas, the ionization gas is pulled to an emitter tip surface by the intense electric field. After that, the ionization gas reaches in the vicinity of the tip of the emitter tip 21 where the electric field is strongest. The field ionization is caused by the ionization gas and an ion beam is generated. The ion beam is led to the ion beam irradiation system via the hole 27 of the extraction electrode 24. In the embodiment, argon gas is introduced.

Next, the ion beam 31 emitted from the gas field ion source 1 passes straight through the separator 7 while being focused by the focusing lens 5, travelling toward the sample 9 as the ion beam 32 approximately parallel to the sample 9.

The focusing lens 5 may be a system of combining plural lenses so as to obtain an irradiation ion beam having higher parallelism with respect to the sample. The focusing lens 5 is adjusted so that the ion beam is focused to a back focal plane of the objective lens 8. The separator 7 separates the irradiation ion beam 32 travelling toward the sample 10 from an ion beam 33 returning upward from the sample 9. As the separator 7 in the present embodiment, an (E×B) deflector in which an electric field is orthogonal to a magnetic field is used as an example. The E×B deflector allows the ion beam 32 travelling from the ion source toward the sample 9 to travel straight and allows the ion beam 33 travelling upward from the sample to deflect in a detector direction according to characteristics thereof. Next, the ion beam 32 travelling from the ion source 1 toward the sample 9 is formed as an ion beam of a parallel flux travelling perpendicularly toward the sample surface by the electrostatic objective lens 8. As the ion irradiation system focusing lens 5 is adjusted so that the ion beam is focused to a back focus of the objective lens 8 as described above, therefore, the sample 9 can be irradiated with the ion beam having high parallelism.

In the above case, the ion-beam irradiation system column 2 that supplies the irradiation ion beam stands upright with respect to the microscope installation surface 20, namely, the floor, and the ion detection system column 6 that images a mirror ion beam is tilted as shown in FIG. 1. According to the structure, the irradiation ion beam 31 travels straight to the direction of the sample 9 without being deflected by the separator 7, therefore, an aberration of the beam applied to the sample is reduced and the ion beam 32 having good parallelism travels toward the sample 9. As a result, it has been found that resolution of a mirror ion image trajectories of which are reversed before reaching the sample is increased. On the other hand, as another choice of structures, there is a structure in which the ion source 1 and the ion irradiation system column 2 are arranged in a tilted manner to allow the irradiation ion beam to be deflected by the separator and to travel toward the sample as well as allow mirror ions to travel straight. However, it has been found that the above-described structure in which the ion-beam irradiation system column 2 stands upright can improve resolution of the mirror ion image more than the above structure.

The sample 9 is placed on the sample stage 10 through the insulator 29. The sample stage 10 can perform rotating motion around the center of the sample 9 as a rotation center, linear motion in a radius direction of the sample, linear motion in a perpendicular direction of the sample and linear motion in a vertical direction. When the sample stage 10 moves in the radius direction of the sample 9 while rotating, the entire surface of the sample 9 can be observed. The motion of the sample state 10 is controlled by the sample stage controller 97.

Then, when a positive potential slightly higher than the accelerating voltage of the ion beam is applied to the sample 9 by a high-voltage power supply, the irradiation ion beam 32 is decelerated before the sample 9 due to the positive potential, and a trajectory thereof is reversed before the beam collides with the sample 9. That is, the beam becomes mirror ions 33.

Next, the mirror ions 33 form a first image by the objective lens 8. As the separator 7 is the (E×B) deflector in the present embodiment, the separator is controlled with a deflection operation with respect to the ion beam 33 travelling from the sample direction, and the mirror ions 33 travel by receiving deflection. The first image is sequentially formed by the intermediate ion lens 51 and the projection ion lens 52. These intermediate lens 51 and the projection lens 52 are electrostatic lenses formed by plural electrodes. A final ion image is enlarged and projected on the image detection unit 53. It is desirable that the first image is formed in the center of the separator 7. That is because effects of the aberration of the separator 7 with respect to the image due to the electromagnetic field can be minimum according to the above. Although the projection ion lens 52 is drawn as one ion lens in FIG. 1, it may be configured by plural ion lenses for enlargement at high magnification or correction of image distortion.

The image detection unit 53 converts an image of the mirror ions 33 into an electrical signal and sends the signal to a foreign matter determination unit of the main body controller 99. The control of the ion optical systems such as various ion lenses and the separator 7 described above is performed by the projection-type ion optical system controller 192.

Next, the image detection unit 53 will be explained. Concerning the image, the mirror ions 33 are converted into light by the fluorescent screen 54 and converted into an electrical signal by the two-dimensional optical detector 55. Alternatively, it is possible to output ions directly as an image signal without conversion into an optical image by a micro-channel plate and so on.

A mirror ion microscope image obtained at this time is not affected by a stray magnetic field in an installation position of the microscope, and a high-resolution image with less shakes and drift in the image can be obtained as compared with the conventional mirror electron microscope image. This is essentially due to the difference of sensitivity with respect to the magnetic field between electrons and ions. It has been ascertained that the mirror ion image can be high in resolution due to the above effects particularly in high-resolution mirror ion images.

Next, the foreign matter determination unit in the main body controller 99 determines existence of a foreign matter from image data from the image detection unit 53. When a foreign matter is detected, the foreign matter determination unit calculates coordinates of the foreign matter on the sample based on the image data and data concerning a stage position from the stage controller 97. The foreign matter determination unit also estimates a size of the foreign matter from an intensity profile of the foreign matter image and stores the position and the size of the foreign matter.

Operation conditions of respective units of the device are inputted/outputted from the main body controller 99. In the main body controller 99, various conditions such as an accelerating voltage used when the ion beams is generated, a deflection width and a deflection speed of the ion beam, a stage movement speed and fetch timing of image signals from an image detection device are inputted as table data in advance. Then, the main body controller 99 comprehensively controls controllers of respective elements, and also has an interface for input from a user. The main body controller 99 may be configured by plural calculators which share functions and connected by communication lines.

According to the above, a mirror ion microscope is configured by including a gas field ion source, an optical system for emitting a gas ion beam in a sample direction, an optical system for imaging mirror ions trajectories of which are reversed by a positive potential applied to the sample before gas ions collide with the sample and a detector for detecting the mirror ions, thereby obtaining a mirror ion microscope image on the sample surface and realizing the mirror ion microscope capable of detecting a minute foreign matter.

According to the structure, a device particularly including an imaging-type or a projection-type ion detection system in a sample observation device using an ion beam and capable of observing or detecting the sample at high speed by detecting mirror ions is provided. Additionally, an inspection device capable of detecting a foreign matter or a defect on the sample at high speed can be provided. In particular, there are advantages that detection of foreign matters with high resolution can be achieved without being affected by a stray magnetic field in an installation position of the microscope with less shakes and drift in the image as compared with the conventional mirror electron microscope. Furthermore, there is an advantage that a mirror microscope image with higher resolution can be obtained by using the gas field ion source as compared with cases where other ion sources are used.

Then, when a voltage applied to the sample is a positive potential lower than an accelerating voltage of an ion beam, the ion beam collides with the sample. Part of collided ions are emitted to a vacuum as reflected ions. Part of them cause cascade collision inside the sample. As a result, the sputtering phenomenon in which atoms on the sample surface dissipate into a vacuum occurs. It is possible to perform so-called surface cleaning for removing contaminants adhered to the sample surface by utilizing the effect. This will be explained with reference to FIG. 3.

FIG. 3 shows schematic views of a mirror-ion microscope image 202, a sample 203, equipotential surfaces 204, beam trajectories 205 and so on seen from a lateral direction of the sample. First, in FIG. 3 (*a*), when an accelerating voltage of irradiation ions is positive 3 kV, a sample application voltage of 2.8 kV is applied. Naturally, the voltage to be applied is an example and is not limited to this. In this case, argon ions 205 emitted from the gas field ion source collide with the sample 203 to thereby remove contaminants on the sample surface. So-called surface cleaning is performed. After that, as shown in FIG. 3 (*b*), a vicinity of 3 kV is applied as the sample application voltage to perform more accurate voltage adjustment, thereby allowing the trajectories of the argon ions 205 to be reversed before colliding with the sample 203 and detecting mirror ions 207. That is, the mirror ion microscope image 202 is obtained. At this time, a foreign matter image 208 is seen in the vicinity of the center of the mirror-ion microscope image 202. According to the above procedure, a foreign matter 206 can be detected after contaminants on the sample surface are removed.

That is, a mirror ion microscope characterized by including a controller that stores two or more kinds of values of positive potential to be applied to the sample which are a positive potential allowing the ion beam to collide with the sample and a positive potential reversing the trajectory before the ion beam collides with the sample, in which a mirror ion microscope image can be obtained by irradiating the surface with the ion beam at extremely low acceleration and removing part of atoms on the sample surface, namely, after the surface cleaning is performed. That is, an advantage that even a foreign matter hidden by contaminations can be observed or detected is obtained. These advantages are peculiar to the mirror ion microscope, and the cleaning, surface movement to the depth direction and the like are extremely difficult for the conventional electron beam. In particular, in the mirror ion microscope using the gas field ion source, adjustment of a current amount is easy and further higher effects can be obtained.

Next, when a voltage to be applied to the sample is further lower, sputtering effects are increased. When the effects are utilized well, it is possible to retract the surface in a depth direction of the sample by sputtering the surface. This will be explained with reference to FIG. 4.

Figures 4A, 4B, 4C:
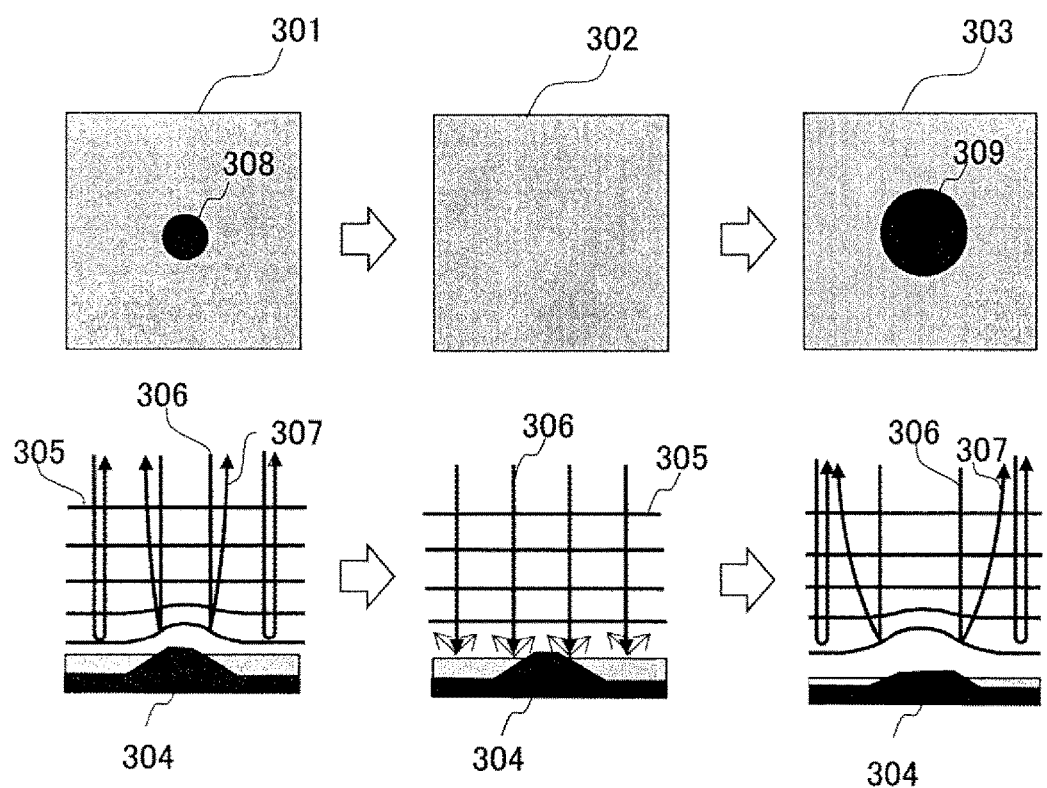
FIGS. 4A to 4C are schematic views showing operations of the ion beam device according to the present invention.

FIG. 4 shows schematic views of mirror ion microscope images 301, 303, and a sample 304, equipotential surfaces 305, beam trajectories 306 and so on seen from a lateral direction of the sample. First, in FIG. 4 (*a*), when an accelerating voltage of irradiation ions is positive 3 kV, the mirror ion microscope image 301 is obtained. Naturally, the voltage to be applied is an example and is not limited to this. At this time, a foreign matter image 308 is seen in the vicinity of the center of the mirror-ion microscope image 301. Next, as shown in FIG. 4 (*b*), when an accelerating voltage of irradiation ions is positive 3 kV, a sample application voltage of 2.5 kV is applied. In this case, argon ions 306 emitted from the gas field ion source collide with the sample 304 to thereby retract the surface in the depth direction of the sample by sputtering the sample surface. Next, in FIG. 4 (*c*), a vicinity of 3 kV is applied as the sample application voltage to perform more accurate voltage adjustment, thereby reversing the trajectories of the argon ions 306 before colliding with the sample 304 to be detected as mirror ions 307. That is, the mirror ion microscope image 303 is obtained. A foreign matter image 309 is seen in the vicinity of the center of the mirror-ion microscope image 303, however, it is found that the foreign matter image 309 is increased as compared with the foreign matter in the mirror ion microscope image 301 as the sample surface is retracted in the depth direction. According to this process, foreign matter structure information in a depth direction from the sample surface can be obtained. Furthermore, the sample application voltage of 2.5 kV is applied again and the surface is further retracted by sputtering the sample surface. Next, when the mirror ion microscope image is obtained by applying the voltage to the sample, foreign matter structure information at a deeper position can be obtained. In FIG. 4, states where the foreign matter differs in size in the depth direction are illustrated. To obtain such mirror ion microscope images in the depth direction is a peculiar effect of the mirror ion microscope, and it is extremely difficult in the conventional electron beam. In particular, the mirror ion microscope using the gas field ion source can adjust the current amount easily and has further higher effects.

Though the explanation has been made by using argon ion in the present embodiment, the same advantages can be obtained also by using xenon, krypton and so on. Additionally, there is an advantage that the microscope is not easily affected by magnetic field noise. In particular, there is an advantage that processing in the depth direction with low damage at high speed can be performed as compared with cases of using hydrogen and neon. In cases of using helium and neon, an advantage that processing with less movement of atoms on the sample surface can be performed or an advantage that thermal damage is small can be obtained. Note that mixed gases containing plural types of gasses such as a mixed gas of two types and a mixed gas of three types may be used.

The present invention is not limited to the above embodiments and various modification examples are included. The above embodiments have been explained in detail for explaining the present invention easily to understand, and the present invention is not always limited to embodiments including all explained components. It is also possible to replace or to add/delete/displace part of components in a certain embodiment with respect to components of another embodiment within a scope not departing from the idea of the invention of the present application.

REFERENCE SIGNS LIST

1 . . . gas field ion source, 2 . . . ion-beam irradiation system column, 3 . . . sample chamber, 4 . . . cooling mechanism, 5 . . . focusing lens, 6 . . . imaging-type detection system column, 7 . . . separator, 8 . . . objective lens, 9 . . . sample, 10 . . . sample stage, 11 . . . charged particle detector, 12 . . . ion source vacuum evacuation pump, 13 . . . sample chamber vacuum evacuation pump, 15 . . . vacuum chamber, 17 . . . device frame, 18 . . . base plate, 19 . . . anti-vibration mechanism, 20 . . . floor, 21 . . . emitter tip, 22 . . . filament, 23 . . . filament mount, 24 . . . extraction electrode, 26 . . . gas supply mechanism, 27 . . . opening, 51 . . . intermediate ion lens, 52 . . . projection ion lens, 53 . . . image detection unit, 54 . . . fluorescent screen, 55 . . . two-dimensional optical detector, 61 . . . tilt mechanism, 64 . . . emitter base mount, 69 . . . valve capable of executing vacuum interruption, 70 . . . non-evaporable getters, 71 . . . vacuum pump, 72 . . . heating mechanism, 74 . . . valve capable of executing vacuum interruption, 77 . . . valve capable of executing vacuum interruption, 91 . . . gas field ion source controller, 92 . . . refrigerator controller, 93 . . . lens controller, 97 . . . sample stage controller, 98 . . . vacuum evacuation pump controller, 99 . . . main body controller, 191 . . . separator controller, 192 . . . ion optical system controller, 193 . . . image detection unit controller, 202 . . . mirror-ion microscope image, 203 . . . sample, 204 . . . equipotential surface, 205 . . . beam trajectory, 206 . . . foreign matter, 207 . . . mirror ion, 208 . . . foreign matter image, 301 . . . mirror ion microscope image, 303 . . . mirror ion microscope image, 304 . . . sample, 305 . . . equipotential surface, 306 . . . beam trajectory, 307 . . . mirror ion, 308 . . . foreign matter image, 309 . . . foreign matter image

The invention claimed is:

1. A mirror ion microscope comprising:
a gas field ion source that generates an ion beam;
an irradiation optical system that irradiates a sample with the generated ion beam;
a potential controller that controls an accelerating voltage of the ion beam and a positive potential to be applied to the sample; and
an imaging-type or a projection-type ion detection unit that images or projects ions reflected from the sample as a microscope image,
wherein the potential controller includes a storage unit storing a first positive potential allowing the ion beam to collide with the sample and a second positive potential reversing a trajectory before allowing the ion beam to collide with the sample; and
wherein the potential controller includes a sputter controller for removing part of a surface of the sample by setting the first positive potential and an image acquisition controller for obtaining a microscope image by setting the second positive potential.

2. The mirror ion microscope according to claim 1, further comprising:
a display unit displaying a first microscope image obtained by setting the second positive potential with respect to a sample observation region and a second microscope image obtained by setting the second positive potential after setting the first positive potential with respect to the sample observation region and performing the sputter.

3. The mirror ion microscope according to claim 1, wherein a gas type to be supplied to the emitter tip when the first positive potential is applied includes at least one type of argon, xenon and krypton.

4. The mirror ion microscope according to claim 1, wherein a gas type to be supplied to the emitter tip when the first positive potential is applied includes at least one type of neon and helium.

5. The mirror ion microscope according to claim 1, an evacuation unit that performs evacuation of the irradiation optical system is provided with a non-evaporable getter pump.

6. An ion beam control method comprising:
a generation step of generating an ion beam;
an irradiation step of irradiating a sample with the generated ion beam;
a potential control step of controlling an accelerating voltage of the ion beam and a positive potential to be applied to the sample; and
an image forming step of imaging or projecting ions trajectories of which are reversed before colliding with the sample by the potential control step as a microscope image;

wherein the potential control step includes a sputtering step of removing part of a surface of the sample by allowing the ion beam to collide with the sample and an image acquisition step of obtaining a microscope image by reversing a trajectory before allowing the ion beam to collide, and the image forming step is a step of imaging or projecting ions trajectories of which are reversed in the vicinity of the sample by the image acquisition step as a microscope image.

7. The ion beam control method according to claim 6, wherein the image acquisition step is repeated at least twice or more in an observation region of the sample in an order of the image acquisition step, the sputtering step and the image acquisition step to thereby obtain two or more microscope images.

8. The ion beam control method according to claim 6, further comprising:

a display step of displaying at least two microscope images in which depth directions are different from each other with respect to the sample surface.

9. A mirror ion microscope comprising:

an ion source that generates an ion beam;

an irradiation optical system that irradiates a sample with the generated ion beam;

a sample potential controller that controls a positive potential to be applied to the sample; and an imaging-type or a projection-type detection optical system that images or projects ions trajectories of which are reversed before colliding with the sample as a microscope image;

wherein a column of the irradiation optical system is provided in a vertical direction with respect to a surface or a floor on which the mirror ion microscope is installed, and a column of the detection optical system is provided in a tilted direction with respect to the surface or the floor on which the mirror ion microscope is installed.

10. The mirror ion microscope according to claim 9, wherein the ion source is a gas field ion source that forms a pyramid structure at a tip of an emitter tip for generating the ion beam.

* * * * *